United States Patent [19]

Nakata et al.

[11] Patent Number: 4,626,789
[45] Date of Patent: Dec. 2, 1986

[54] DEMODULATING CIRCUIT FOR DATA SIGNAL

[75] Inventors: Yukio Nakata, Kawasaki; Osamu Shiotsu, Asaka; Motoyoshi Morito, Iruma; Kaoru Suda, Ohmiyashi, all of Japan

[73] Assignees: Hitachi, Ltd.; Yagi Antenna Co., both of Tokyo, Japan

[21] Appl. No.: 639,412

[22] Filed: Aug. 10, 1984

[30] Foreign Application Priority Data

Aug. 19, 1983 [JP] Japan ................... 58-150258
Aug. 19, 1983 [JP] Japan ................... 58-150257

[51] Int. Cl.[4] ............................................. H03D 3/18
[52] U.S. Cl. ....................................... 329/50; 329/104; 375/94
[58] Field of Search .............. 329/50, 104, 105, 178; 375/94, 99, 104; 455/295

[56] References Cited

U.S. PATENT DOCUMENTS 4,525,676 6/1985 Atobe et al. ............... 329/122 X
4,525,868 6/1985 Kage et al. ................. 455/295 X Primary Examiner—Eugene R. LaRoche
Assistant Examiner—James C. Lee
Attorney, Agent, or Firm—Antonelli, Terry & Wands

[57] ABSTRACT

In a data signal demodulating circuit for demodulating data from a modulated signal burst in which a carrier signal is modulated by a data signal, noise elimination means is provided at at least one of the input and output of an AND circuit, to eliminate noise in periods during which there is no carrier present, by adding an output from a demodulator to an output from a carrier sense circuit, in order to completely eliminate noise occurring at the start and end of a demodulated data signal, and eliminate noise occurring during the rise time and fall time of the carrier sense circuit.

5 Claims, 9 Drawing Figures

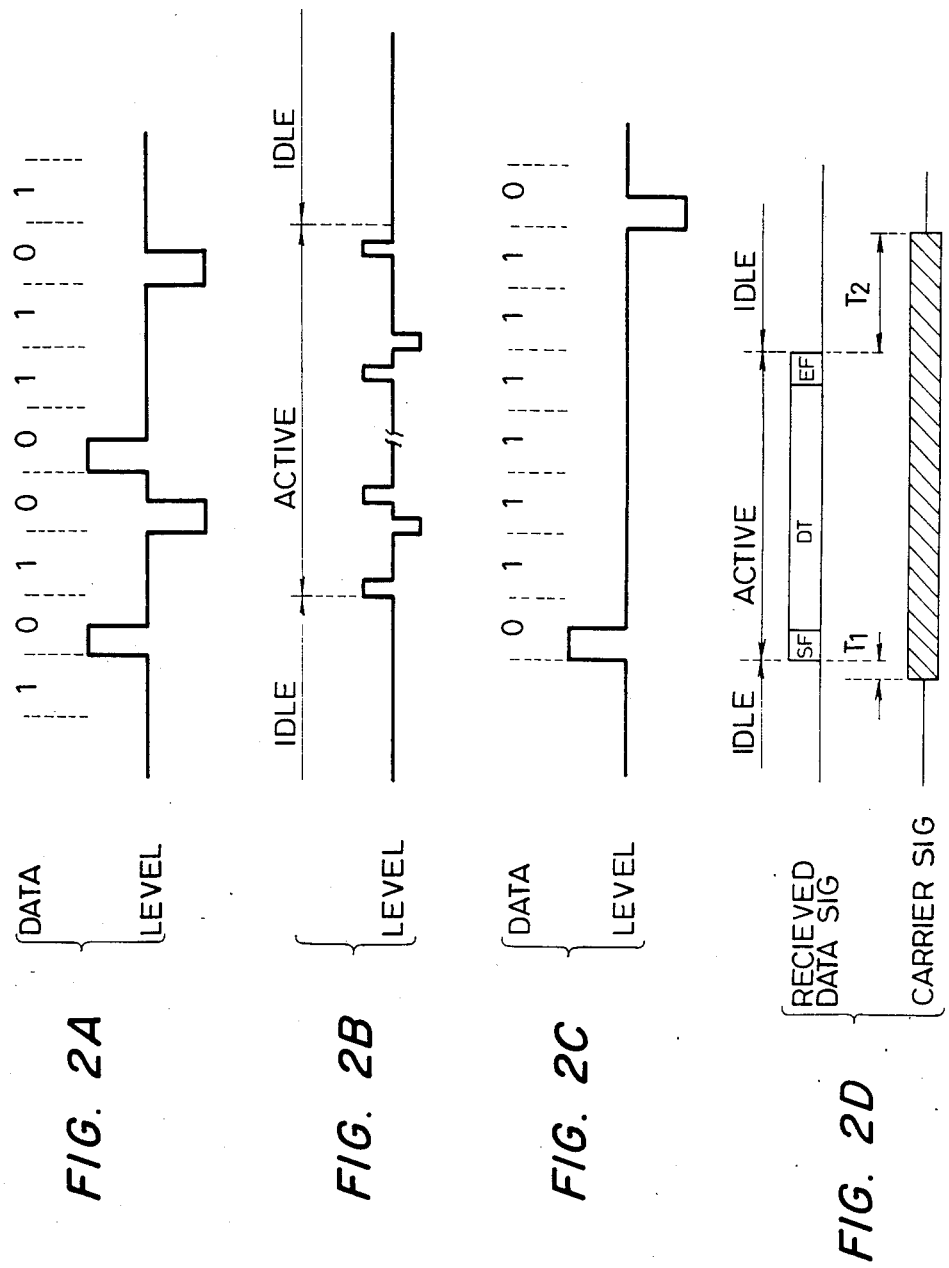

DEMODULATING CIRCUIT FOR DATA SIGNAL

BACKGROUND OF THE INVENTION

(1) Field of the Invention

This invention relates to a demodulating circuit for a data signal. More specifically, the present invention relates to a circuit for demodulating a data signal from a modulated signal burst, in which a carrier signal is moduled by a data signal, that is, from a signal of the type in which the periods during which a modulated signal is present is intermittent.

(2) Description of the Prior Art

Data signal transmission systems include a system which transmits modulated signal bursts prepared by modulating a carrier signal by pulse signals of "1", "0", etc., representing data, or rather a system which transmits such a modulated signal only when a data signal is present. When a data signal from such a transmission system is received and demodulated, it is well known to prepare a reference carrier signal in synchronism with the carrier, and demodulate the data signal using a phase comparator or the like. To ensure that the demodulator operates stably, time periods during which there is no data signal, only the carrier signal, are provided before and after the time period of the data signal.

When such a modulated signal burst is demodulated by the demodulator, noise occurs in the periods during which there is no carrier signal. For this reason, a carrier sense circuit is usually provided parallel to the demodulator to detect the period containing the carrier, and an output from the carrier sense circuit enables output from the demodulator only during the period in which the carrier is present.

However, in practice, the operation of this carrier sense circuit is subject to a certain time delay. In other words, the output of the carrier sense circuit lags slightly behind the period of time in which the carrier signal is present. This results in the problem that the period during which noise is generated in the demodulator's output does not exactly coincide with the period during which the output from the carrier sense circuit, that is, a signal range indicating the absence of the carrier, is off. Therefore, this circuit can not completely eliminate noise from the output of the demodulator.

This noise signal has an adverse effect upon any equipment (e.g. a computer) to which the data signal which is the output of the demodulator is input.

SUMMARY OF THE INVENTION

In a demodulating circuit for a data signal which receives as an input signal thereto a modulated signal burst formed by modulating a carrier signal by a data signal, the present invention is directed to realizing a data signal demodulating circuit which eliminates noise that occurs after the start of reception of the carrier signal and at the end of reception thereof.

In a data signal demodulating circuit for demodulating a modulated signal burst which has domains in which only the carrier signal is present before and after a data signal domain, the object of the present invention can be accomplished by a data signal demodulating circuit which includes a demodulator and a carrier sense circuit connected to each other, a first circuit which obtains the logical product (AND) of outputs from the carrier sense circuit and the demodulator, and extracts demodulated data from the output of the demodulator; and means which eliminates noise signals occurring at the rise or fall of the carrier signal, which is provided at at least one of the input and output of the first circuit.

The above and other objects and features of the present invention will become more apparent from the following description, to be taken in connection with the accompanying drawings.

BRIEF DESCRIPTION OF THE DRAWINGS

FIGS. 2A through 2D are waveform charts illustrating the construction of a modulated signal burst;

DESCRIPTION OF THE PREFERRED EMBODIMENTS

Figure 1:
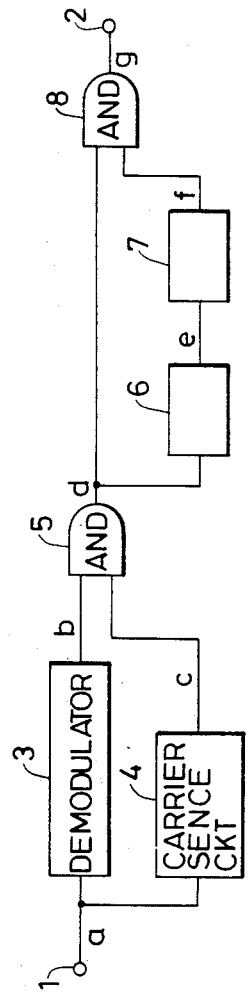
FIGS. 1 and 5 are each block diagrams of the constructions of data signal demodulating circuits in accordance with preferred embodiments of the invention.

FIG. 1 is a block diagram of the construction of a data signal demodulation circuit in accordance with one embodiment of the present invention.

In the drawing, a modulated signal burst is applied to a demodulator 3 and a carrier sense circuit 4 through an input terminal 1. Outputs from these circuits 3 and 4 are input to an AND circuit 5. The circuit from the input terminal 1 to the AND circuit 5 is the same as that of a heretofore known circuit, but noise can not be removed sufficiently therefrom, as described elsewhere. Accordingly, in this embodiment, part of the output from the AND circuit 5 is input to a data sense circuit 6 which identifies active periods in which the demodulated data signal is present and idle periods in which it is not. The data sense circuit 6 generates a low-level output signal which goes off after the passage of a predetermined time from the end of an active period. An output signal therefrom is input to a timer circuit 7 which generates a noise-eliminating pulses which go off for a predetermined time after the time at which the output signal from the data sense circuit 6 goes off. A demodulated data signal devoid of noise can be obtained when the outputs of the timer circuit 7 and the AND circuit 5 are input to another AND circuit 8. The operation of each of these portions will be described in detail below.

FIG. 2A is a chart illustrating the signal input to the demodulator, and showing the state of the data signal. The level of the signal does not change for a data "1" bit, but the level thereof changes alternately to positive and negative for the first half of each data "0" bit.

As shown in FIG. 2B, each signal burst consists of idle periods in which the level of the signal does not change, and an active period in which the level does change. A flag signal (8 bits: "01111110"), as shown in FIG. 2C, is inserted at the beginning and end of each active period to indicate its boundary with an idle period. FIG. 2D shows the modulated signal, that is, the received signal burst, divided into the data signal and the carrier signal. The active domain consists of a start flag SF, an end flag EF, and data DT between these flags.

Zeroes are inserted in the data DT between the flags so that a data "0" is added after five consecutive data "1" bits. There is a maximum of six consecutive data "1" bits in one frame, that is a flag.

The carrier signal goes on a time $T_1$ before the start of the received data signal, and goes off a time $T_2$ after the end of the frame of this data signal.

Figure 3:
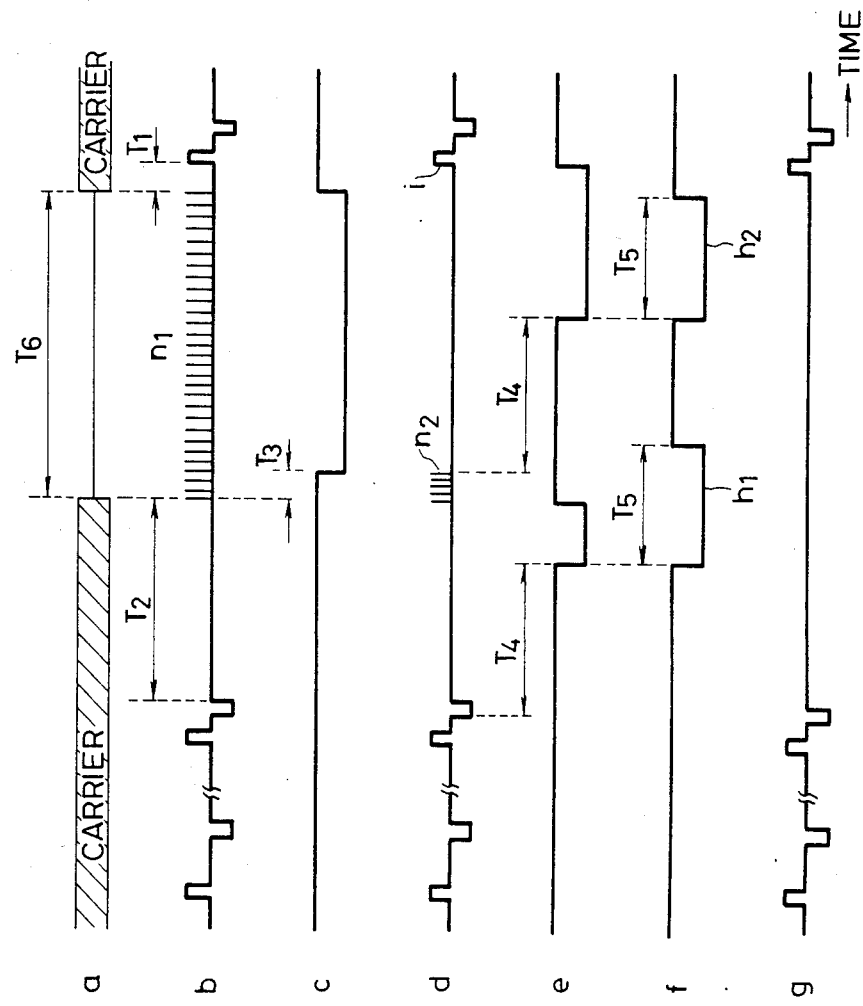
FIG. 3 is a timing chart illustrating the operation of the embodiment of FIG. 1.

FIG. 3 shows the signal waveform at various portions of the embodiment of FIG. 1. The letters a to i on the left of the Figure correspond to those of FIG. 1.

When the modulated signal a is applied to the input terminal 1 of the demodulator 3 of FIG. 1, the demodulator outputs the demodulation signal b. In the demodulation signal, noise $n_1$ occurs for a period $T_6$ during which the carrier signal is not present, that is, the period between adjacent signal bursts.

At the same time, the modulated signal a is also input to the carrier sense circuit 4 which detects the period during which the carrier is present, and outputs a signal c which rises to high level during the period in which the carrier is present. This carrier circuit 4 turns the output off (low level) after the passage of a predetermined period $T_3$ (fall time) from the end of the carrier signal.

The modulated signal b and the carrier sense signal c are input to the AND gate 5, which outputs a demodulated data signal d. A noise component $n_2$ remains in the demodulated data signal d for the predetermined period of time $T_3$ that the carrier sense signal after the end of the carrier signal. One of the most important functions of this embodiment is to eliminate this noise component.

Part of the demodulated data signal d is input to the data sense circuit 6 which identifies the idle and active periods. The data sense circuit 6 outputs a data sense signal e which goes off (low level) after the passage of a predetermined period of time $T_4$ from the end of data.

This data sense signal e is also input to the timer circuit 7, which generates noise-eliminating pulses f. These pulses remain off (low level) for a predetermined period of time $T_5$ from the time at which the data sense signal e goes off.

The noise-eliminating pulses f and the demodulated data signal d are input to the AND circuit 8, which outputs a received-data signal g from which the noise component $n_2$ has been eliminated.

The data sense circuit 6 and the timer circuit 7 each consists of a counter or a trigger type of monostable multivibrator. The periods $T_4$ and $T_5$ are set in the following manner.

In order to completely eliminate the noise component $n_2$ from the demodulated data signal d by a noise-eliminating pulse $h_1$, it is necessary that the noise-eliminating pulse $h_1$ is already off (low level) at the leading edge of the noise component $n_2$, and must be kept off until the end of the noise component $n_2$. In other words, the following relationships must be satisfied:

$$T_4 < T_2 \tag{1}$$

$$T_4 + T_5 > T_2 + T_3 \tag{2}$$

The data sense signal e is turned on again by the start of the noise component $n_2$, and goes off after the end of the idle detection time $T_4$. A second noise-eliminating pulse $h_2$ is generated by the change of the data sense signal e from on to off.

To prevent the leading edge i of the next reception frame being erased by this second noise-eliminating signal $h_2$, the following relationship must be satisfied for the period $T_6$ in which the carrier is not present:

$$T_3 + T_4 + T_5 < T_6 + T_1 \tag{3}$$

where
$T_1$ is the time from the start of the carrier to the start of the active period and
$T_2$ is the time from the end of the active period to the end of the carrier.

A data demodulation circuit which can completely eliminate the noise component $n_2$, but does not have any adverse effect on the data of subsequent frames can be constituted by setting the idle detection time $T_4$ and the noise-eliminating pulse width $T_5$ so as to satisfy the conditions (1), (2) and (3) above.

Figure 4:
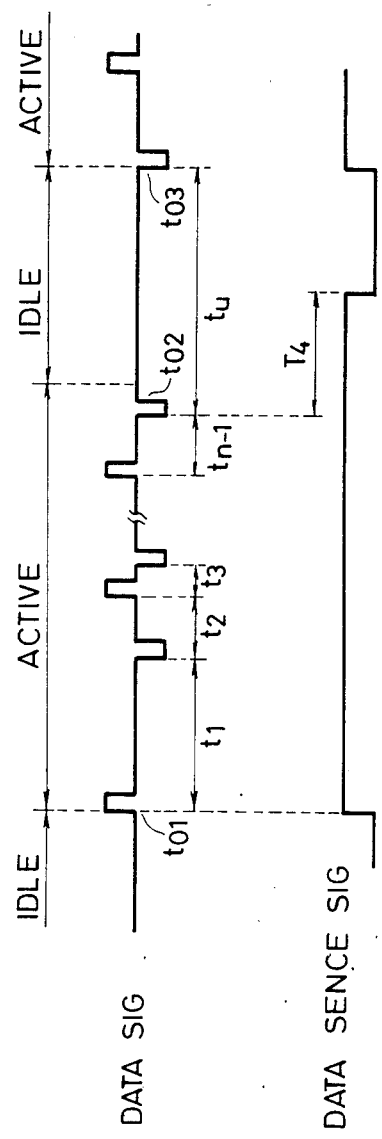
FIG. 4 is a timing chart illustrating the operation of the data sense circuit 5 of FIG. 1.

The operation of the data sense circuit 6 will now be described with reference to FIG. 4.

The data sense circuit 6 turns the data sense signal on from a time $t_0$ at which the transmitted data signal changes from idle state to active state. It supervises the time $t_1$ from the first data "O" to the next data "O", after the data sense signal is thus turned on. If this time $t_1$ is shorter than the pre-set time $T_4$, the circuit supervises a time $t_2$ until the next data "O", while keeping the data sense signal on. If $t_1$ is longer than $T_4$, the circuit turns the data sense signal off after the passage of the time $T_4$ from the start of the time supervision, and keeps it off until a data "O" in the next transmitted data signal. The data sense signal is obtained by this time supervision of $t_1, t_2 \ldots t_n$.

In the active period, the maximum value of the spacing between a data "O" and the next data "O" is the 7-bit period of a flag, as shown in FIG. 2C. Therefore, if $T_4$ is longer than a 7-bit period, the data sense signal does not go off during the period in which the transmitted data signal is active.

Thus, the data sense signal goes on at the time $t_{o1}$ at which the transmitted data signal changes from the idle state to the active, goes off after the passage of the time $T_4$ from the last "O" data $t_{o2}$ in an active period, and goes on again at the leading edge $t_{o3}$ of the next active period.

As described above, in a circuit for demodulating reception signals that are input in bursts, this embodiment can completely eliminate noise after an interruption of the carrier signal, that is not completely eliminated in prior-art circuits, and does not have any adverse effect on subsequent data.

Although this embodiment has been described with reference to a received-data signal and carrier signal such as those shown in FIGS. 2A through 2C, the present invention is not particularly limited thereto, but can be applied to received data signals in which the idle and active periods can be distinguished, such as signals which are coded only during the active period (e.g. Manchestor code, CMI, etc), by setting the frame end detection time $T_4$ and the noise-eliminating pulse width $T_5$ as appropriate.

Figure 5:
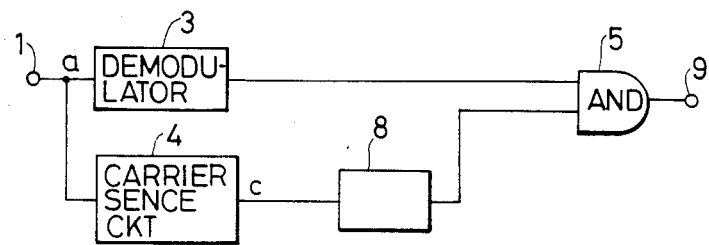

FIG. 5 is a block diagram of the construction of a signal-demodulating circuit in accordance with another embodiment of the present invention. This embodiment is particularly effective for eliminating the adverse effects of noise at the start of the carrier signal.

In FIG. 5, the constructions of the input terminal 1, demodulator; 3, AND circuit 5, and carrier sense circuit 4 are the same as those denoted by the same reference numerals in FIG. 1.

Figure 6:
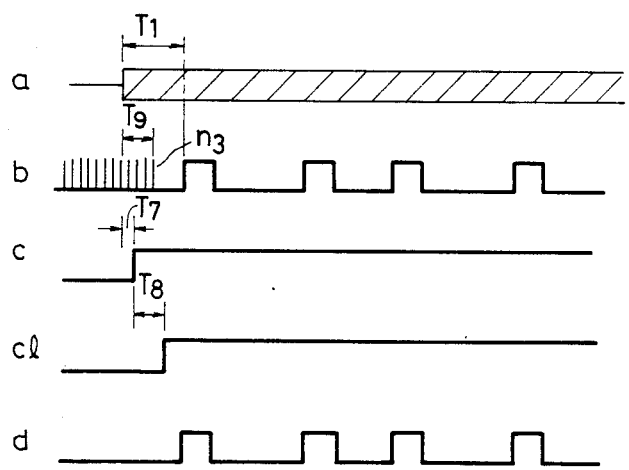
FIG. 6 is a timing chart illustrating the operation of the embodiment of FIG. 5.

In this embodiment, the output of the carrier sense circuit 4 is applied to the AND circuit through a delay circuit 8 which delays it for a predetermined period of time. When the carrier signal a of FIG. 6 is applied to the input terminal 2, the demodulator 3 outputs a demodulated data signal b. Noise $n_3$ occurs in this demodulated data signal b for a period $T_9$ (rise time) between the time at which the carrier signal is not present and the time at which the demodulator starts its practical operation. The carrier sense circuit 4 detects the period during which the carrier is present, from the received signal a, but the detection output c therefrom is delayed a predetermined period of time $T_7$ (rise time) from the rise of the carrier in the signal a. If the relationship $T_7 < T_9$ holds, the noise within the period $T_9 - T_7$ can not be removed, but remains as noise even if the output of the demodulator 3 and the output of the carrier sense circuit are input to the AND circuit 5, and has an adverse effect on the other circuits. Therefore, this embodiment is constructed so that the output c from the carrier sense circuit 4 is delayed a predetermined period of time $T_8$, and is then input to the AND circuit 5.

This delay time $T_8$ is determined in the following manner. The rise of the delayed signal Cl must occur before the first data signal, that is, it must be less than $T_1$, and must also be after the period of time $T_9$ during which the noise is present. The delay time $T_8$ must be set to satisfy the following relationship because the rise of the delayed signal Cl is at a time $T_7 + T_8$ after the rise of the carrier of the signal a:

$$T_9 < T_8 + T_7 < T_1$$

This embodiment is effective for removing the noise in the output of the demodulator 3 at the start of the carrier signal. This embodiment can be used either alone, or in combination with the embodiment of FIG. 1, when noise at the start of the carrier signal and at the end thereof is a problem. In other words, the delay circuit 8 may be inserted between the carrier sense circuit 4 and the AND circuit 5 of FIG. 1.

What is claimed is:

1. A data signal demodulating circuit for demodulating modulated signal bursts provided with periods during which only a carrier signal is present, before and after a data signal period, said circuit comprising:
    a demodulator for demodulating data from said modulated signal;
    a carrier sense circuit for detecting the period during which said carrier is present, from said modulated signal;
    a first AND circuit for receiving an output from said demodulator and an output from said carrier sense circuit;
    a data sense circuit for detecting the presence of said data signal from an output from said first AND circuit;
    a timer driven by said output from said data sense circuit; and
    a second AND circuit for receiving an output from said timer and said output from said first AND circuit.

2. The data signal demodulating circuit as defined in claim 1, wherein said data sense circuit is a circuit which changes the level of said output therefrom after the passage of a predetermined period of time $T_4$ from the detection of the last pulse indicating data, said timer is a circuit which generates a signal impeding the output from said AND circuit for a predetermined period of time $T_5$ from the time at which said data sense circuit changes the level of said output therefrom, and said time $T_4$ and said time $T_5$ satisfy the following relationships with a time $T_2$ during which the carrier signal is present after the end of said modulated signal burst, and with a fall time $T_3$ of said carrier sense circuit:

$$T_4 < T_2$$

$$T_4 + T_5 > T_2 + T_3$$

3. The data signal demodulating circuit as defined in claim 2, wherein a time $T_1$ at the start of said modulated signal burst during which only the carrier signal is present, and a time $T_6$ between adjacent modulated signal bursts during which the carrier signal is not present satisfy the following relationship:

$$T_3 + T_4 + T_5 < T_6 + T_1$$

4. The data signal demodulating circuit as defined in claim 1 which further includes a delay circuit connected between an output terminal of said carrier sense circuit and an input terminal of said first AND circuit.

5. The data signal demodulating circuit as defined in claim 4 wherein a delay time $T_8$ of said delay circuit satisfies the following relationship:

$$T_9 < T_8 + T_7 < T_1$$

where $T_7$ is the rise time of said carrier sense circuit, $T_1$ is a time at the start of said modulated signal burst during which only the carrier signal is present and $T_9$ is a period between the time at which the carrier signal is not present and the time at which the modulator starts its practical operation.

* * * * *